(12) United States Patent
Merassi et al.

(10) Patent No.: US 7,322,242 B2
(45) Date of Patent: Jan. 29, 2008

(54) MICRO-ELECTROMECHANICAL STRUCTURE WITH IMPROVED INSENSITIVITY TO THERMOMECHANICAL STRESSES INDUCED BY THE PACKAGE

(75) Inventors: Angelo Merassi, Vigevano (IT); Bruno Murari, Monza (IT); Sarah Zerbini, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/201,268

(22) Filed: Aug. 10, 2005

(65) Prior Publication Data

US 2006/0032310 A1    Feb. 16, 2006

(30) Foreign Application Priority Data

Aug. 13, 2004   (EP) .................................. 04425630

(51) Int. Cl.
  *G01P 15/00*   (2006.01)
(52) U.S. Cl. ............................ 73/514.38; 73/514.35; 257/734
(58) Field of Classification Search ............ 73/514.35, 73/514.38; 257/734
  See application file for complete search history.

(56) References Cited

U.S. PATENT DOCUMENTS

| | | | |
|---|---|---|---|
| 5,565,625 A * | 10/1996 | Howe et al. ............. | 73/514.16 |
| 5,756,901 A * | 5/1998 | Kurle et al. ............. | 73/777 |
| 5,780,740 A | 7/1998 | Lee et al. ............. | 73/504.12 |
| 5,983,721 A * | 11/1999 | Sulzberger et al. ...... | 73/514.32 |
| 6,508,124 B1 | 1/2003 | Zerbini et al. .......... | 73/514.32 |

FOREIGN PATENT DOCUMENTS

| EP | 1 083 144 A1 | 3/2001 |
|---|---|---|
| EP | 1 083 430 A1 | 3/2001 |
| WO | WO 2004/010150 A2 | 1/2004 |

\* cited by examiner

*Primary Examiner*—Daniel S. Larkin
*Assistant Examiner*—Samir M. Shah
(74) *Attorney, Agent, or Firm*—Lisa K. Jorgenson; Harold H. Bennett, II; Seed IP Law Group PLLC (57) ABSTRACT

In a micro-electromechanical structure, a rotor has a centroidal axis and includes a suspended structure which carries mobile electrodes. A stator carries fixed electrodes facing the mobile electrodes. The suspended structure is connected to a rotor-anchoring region via elastic elements. The stator includes at least one stator element, which carries a plurality of fixed electrodes and is fixed to a stator-anchoring region. One of the rotor-anchoring regions and stator-anchoring regions extends along the centroidal axis and at least another of the rotor-anchoring regions and stator-anchoring regions extends in the proximity of the centroidal axis.

39 Claims, 3 Drawing Sheets

MICRO-ELECTROMECHANICAL STRUCTURE WITH IMPROVED INSENSITIVITY TO THERMOMECHANICAL STRESSES INDUCED BY THE PACKAGE

BACKGROUND OF THE INVENTION

1. Field of the Invention

The present invention relates to a micro-electromechanical structure, in particular to an accelerometer, with improved insensitivity to the thermomechanical stresses induced by the package.

2. Description of the Related Art

As is known, micromachining techniques enable manufacturing of micro-electromechanical structures (MEMS) within layers of semiconductor material, which have been deposited (for example, a polycrystalline silicon layer) or grown (for example, an epitaxial layer) on top of sacrificial layers, which are removed via chemical etching.

In particular, accelerometers obtained using micromachining techniques comprise mobile regions (rotor regions) suspended with respect to a substrate, and fixed regions (stator regions) fixed to the substrate and in particular to the package of the accelerometer. The rotor regions are connected to the substrate through elastic biasing elements (called springs), and are mobile with respect to the stator regions along one or more axes, which constitute the axes of detection of the accelerometer.

The various regions that make up the micro-electromechanical structures can have different coefficients of thermal dilatation, especially when they are subjected to different dopings, and consequently residual thermomechanical stresses may be present in the microstructures at the end of machining. In particular, the material of the package has a different coefficient of thermal dilatation as compared to the material of the micro-electromechanical structure (generally monocrystalline or polycrystalline silicon). Consequently, the suspended masses can be subjected to minor relative displacements with respect to the fixed regions of the micro-electromechanical structure.

The presence of residual stresses leads to considerable problems for the proper operation of the micro-electromechanical devices. For example, in the case of micro-electromechanical structures comprising a mobile mass having a plurality of anchoring points, the thermomechanical stresses, acting in a different and non-uniform way on the various anchoring points, tend to create tensile and compressive stresses and to modify the positions of the various parts of the structure with respect to one another. This leads to alterations in the performance of the devices, in particular measurement errors and drifts, which moreover vary according to the production lot, and at times also between devices belonging to a same production lot.

In order to overcome these problems, U.S. Patent No. 6,508,124 in the name of the present applicant and published in the U.S. on January 21, 2003, describes a micro-electromechanical structure comprising a rotor having a centroidal axis and a suspended mass arranged at a certain distance from the centroidal axis. A plurality of mobile electrodes extend from the suspended mass. The rotor is supported and biased by a suspension structure having a single central anchoring portion extending along the centroidal axis and integral with a body of semiconductor material. The micro-electromechanical structure further comprises a stator made up of a plurality of fixed electrodes, comb-fingered with respect to the mobile electrodes, each fixed electrode being fixed to a respective anchorage. The fixed electrodes and the respective anchorages are arranged at least partially inside the suspended mass, some of them being close to the rotor anchorage.

The presence of a single central anchoring region for the rotor, arranged along the centroidal axis of the structure, enables an improved insensitivity to thermomechanical stresses to be obtained as compared to microstructures that have a plurality of anchoring elements for the rotor. In fact, in this second case, each anchoring element can undergo, on account of the thermomechanical stresses introduced by the package, a displacement different from the other anchoring elements, causing the deformation of the entire structure, a problem which, instead, does not exist with a single central anchorage.

The solution proposed in the aforementioned U.S. patent does not, however, enable a complete solution of the problems linked thermomechanical stresses, in so far as the rotor anchorage can in any case undergo displacements with respect to at least some of the stator anchorages. Since the measurement of acceleration is linked to the relative distance between rotor electrodes and stator electrodes, these displacements can lead to measurement errors and drifts.

U.S. Pat. No. 6,892,576 describes an accelerometer structure aimed at reducing the offsets due to the aforementioned thermomechanical stresses. In detail, the rotor is here formed by a suspended mass having a peripheral region defining a cavity, and by a plurality of elongated electrodes extending within the cavity from the suspended mass, while the stator is formed by a plurality of fixed electrodes comb-fingered with respect to the mobile electrodes. The suspended mass is anchored to the substrate by at least one anchorage arranged close to the center of the suspended mass. For anchoring the fixed electrodes to the substrate, instead, this solution provides a plurality of anchorages, one for each fixed electrode, of which one is arranged in the proximity of the rotor anchorage and the others are arranged gradually at an increasingly greater distance from the center of the suspended mass. A configuration of this type has the purpose of bringing the stator anchorages and rotor anchorages closer together so that they will undergo substantially equivalent movements in presence of thermomechanical stresses. However, the presence of numerous stator anchorages, and the consequent need to make the corresponding electrical biasing connections, renders it, however, in effect impossible to minimize the distance between all the rotor and stator anchorages, and to position the same stator-anchorages in a position effectively close to the center of the suspended mass.

BRIEF SUMMARY OF THE INVENTION

Various embodiments of the present invention provide a micro-electromechanical structure that has an improved insensitivity to the thermomechanical stresses induced by the package, so as to overcome the problems highlighted above.

According to one embodiment of the present invention there is provided a micro-electromechanical structure comprising a rotor having a centroidal axis and including a suspended structure that carries mobile electrodes, the suspended structure being connected to a rotor-anchoring region of an underlying substrate via elastic elements, and a stator including at least one stator element carrying a plurality fixed electrodes facing the mobile electrodes. The stator element is fixed to a stator-anchoring region of the underlying substrate Either the rotor-anchoring region or the stator-anchoring region extends along the centroidal axis, and the other rotor-anchoring region extends in close proximity to the centroidal axis.

According to an embodiment, the stator includes a plurality of stator elements, each fixed to a respective stator-anchoring region in close proximity to the centroidal axis.

According to an embodiment, the rotor includes a plurality of rotor elements, each fixed to a rotor-anchoring region, or to a respective rotor-anchoring region of the substrate, in close proximity to the centroidal axis.

According to respective embodiments of the invention, a uni-axial, bi-axial, or tri-axial accelerometer is provided.

BRIEF DESCRIPTION OF THE SEVERAL VIEWS OF THE DRAWING(S)

For a better understanding of the present invention, there are now described some preferred embodiments, purely by way of non-limiting example, with reference to the attached drawings, in which.

DETAILED DESCRIPTION OF THE INVENTION

The general idea underlying the present invention is to anchor both the rotor and the stator of the accelerometer to anchoring regions effectively close to the centroidal axis of the microstructures and very close to one another so as to minimize the relative displacements between mobile parts and fixed parts that can result in drifts in the measures supplied by the sensor.

Figure 1:
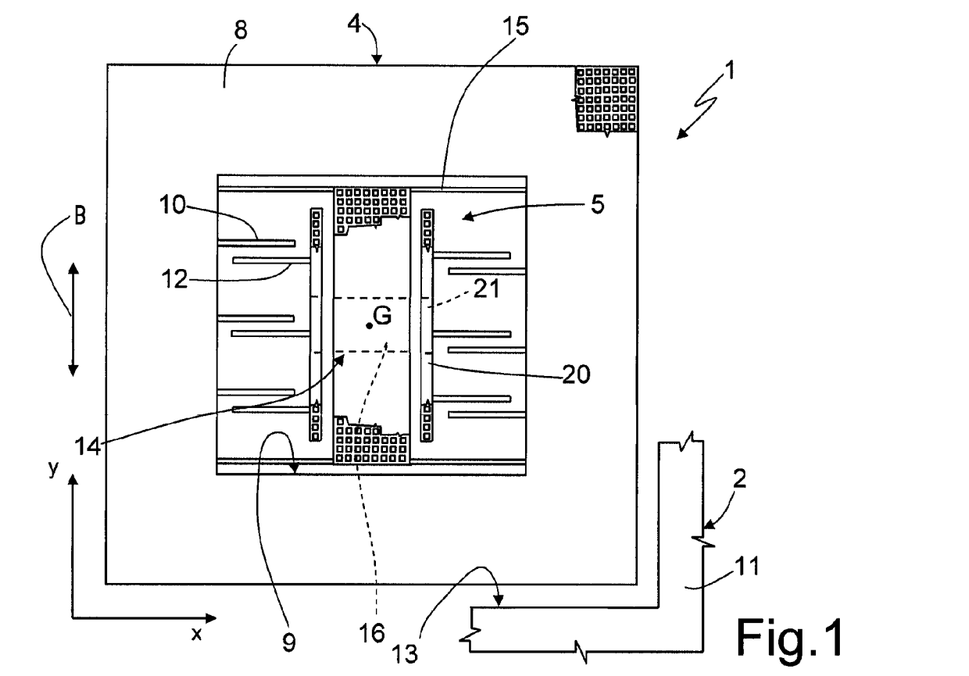
FIG. 1 is a schematic top view of a uniaxial linear accelerometer according to the present invention.

FIG. 1 shows an embodiment of a uniaxial accelerometer 1, of a linear type, integrated in a wafer 2 of semiconductor material, and comprising a rotor 4 and a stator 5. In particular, the uniaxial accelerometer 1 has a centroidal axis G (defined as the axis passing through the center of gravity) coinciding with the axis of symmetry of the accelerometer and extending substantially pependicular to an upper face of the wafer 2 as viewed in the top view of FIG. 1.

The rotor 4 comprises a suspended mass 8 having substantially the shape of a square frame, surrounded by a fixed structure 11 and separated therefrom by a trench 13. The suspended mass 8 delimits a window 9 having a square shape. In particular, the geometrical center of the window 9 is arranged on the centroidal axis G of the uniaxial accelerometer 1, and the sides of the window 9 are arranged two by two parallel to a first axis, designated by x in FIG. 1, and to a second axis, designated by y, orthogonal to the first axis x. The rotor 4 further comprises a plurality of mobile electrodes 10, which extend from the suspended mass 8 towards the inside of the window 9, parallel to the first axis x.

The suspended mass 8 is supported and biased by a suspension structure, comprising a suspension body 14 and elastic elements 15. In particular, the elastic elements 15 enable movement of the suspended mass 8 along the second axis y, as represented by the two-headed arrow B.

At least part of the suspension body 14, like the suspended mass 8, is preferably perforated, so as to allow release of the rotor 4 during the manufacturing process of the accelerometer, by chemical etching away an underlying sacrificial-oxide layer, in a per se known manner.

The suspension body 14 having a rectangular shape is fixed to a rotor-anchoring portion 16 anchored to the substrate (not illustrated) of the wafer 2. The rotor-anchoring portion 16 is arranged centrally with respect to the suspension body 14 and has its center arranged on the centroidal axis G.

The elastic elements 15 are formed by four springs that extend two by two from the extreme edges of the suspension body 14. In particular, the springs 15 have an elongated and thin shape and connect the suspension body 14 to the suspended mass 8.

The stator 5 is positioned inside the window 9, surrounded by the suspended mass 8, and comprises two stator elements 20, each of which carries a respective plurality of fixed electrodes 12.

The stator elements 20 have a rectangular shape, are arranged adjacent to the two long sides of the suspension body 14 and comprise a respective stator-anchoring portion 21 anchored to the substrate of the wafer 2. Furthermore, the stator elements 20 are also, at least in part, preferably perforated.

According to an aspect of the invention, the stator-anchoring portions 21 are arranged adjacent to the rotor-anchoring portion 16 so as to be-positioned in the proximity of the centroidal axis G. Preferably, the center of each stator-anchoring portion 21 is arranged at a minimum distance from the center of the rotor-anchoring portion 16, taking into account the dimensions of the stator anchoring portions and rotor anchoring portions (which must be able to ensure the suspension of the corresponding structures), and of the minimum distances obtainable with current manufacturing processes, in particular silicon etching, which currently allow forming trenches having a minimum width of 1-2 μm.

The fixed electrodes 12 extend from the side of the respective stator element 20 facing the suspended mass 8, parallel to the first axis x and are arranged each in the proximity of and facing a respective mobile electrode 10. In particular, it should be noted that the configuration of the electrodes is not comb-fingered, but single-sided, i.e., each mobile electrode 10 is capacitively coupled to just one fixed electrode 12.

In a per se known manner, the mobile electrodes 10 and the fixed electrodes 12 form a plurality of capacitors, connected together in parallel. A displacement of the suspended mass 8 in the direction of the two-headed arrow B causes a variation in the distance between the mobile electrodes 10, fixed to the suspended mass 8, and the fixed electrodes 12, so that a capacitance variation is obtained. Consequently, by appropriately biasing the fixed electrodes 12 and the mobile electrodes 10 and connecting them to a circuit able to measure capacitive variations, it is possible to detect the movement of the rotor 4 with respect to the stator 5 and to trace back therefrom in a known way to the acceleration undergone by the uniaxial accelerometer 1. In particular, the detection of acceleration is differential, in the sense that the displacement of the fixed electrodes 12 that extend from a first one of the two stator elements 20 occurs in a direction opposite to the displacement of the fixed electrodes 12 that extend from the second of the two stator elements 20. Consequently, there is an opposite capacitive variation for the two sets of fixed electrodes 12, which is detected in a differential way by a purposely provided circuit for treatment of the signals received by the uniaxial accelerometer 1, in a per se known manner.

It is important to emphasize that the rotor-anchoring portion 16, centered on the centroidal axis G, and the stator-anchoring portions 21, which are also close to the centroidal axis G, are very close to one another and to the center of the structure, so that the uniaxial accelerometer 1 is particularly insensitive to thermomechanical stresses.

Figure 2:
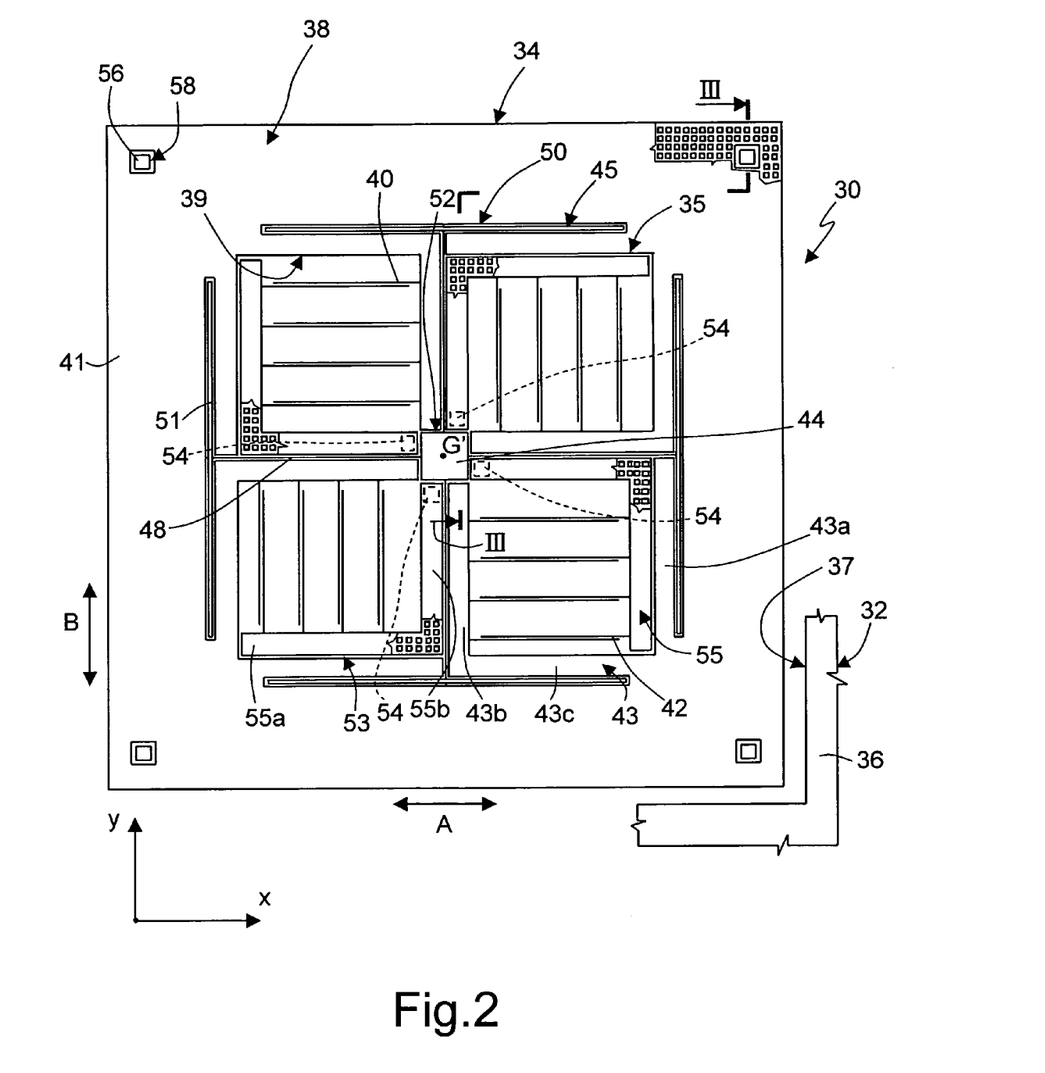
FIG. 2 is a schematic top view of a biaxial linear accelerometer according to the present invention.

FIG. 2 shows an embodiment of a biaxial accelerometer 30 of linear type according to the present invention, integrated in a wafer 32 of semiconductor material and comprising a rotor 34 and a stator 35. In particular, the biaxial accelerometer 30 has a centroidal axis G' coinciding with the axis of symmetry of the accelerometer.

In detail, the rotor 34 comprises a suspended mass 38, having a peripheral region 41 substantially having the shape of a square frame, surrounded by a fixed structure 36 and separated therefrom by a peripheral trench 37. The suspended mass 38 further comprises four U-shaped projecting portions 43, arranged inside the peripheral region 41 and connected to this at its internal corners. The projecting portions 43 are rotated with respect to one another through 90° so as to be arranged two by two symmetrically with respect to the centroidal axis G'. The projecting portions 43 have a first arm 43a and a second arm 43b parallel to one another and a base 43c parallel and adjacent to a respective side of the peripheral region 41. In particular, the first arms 43a are adjacent to one side of the peripheral region 41, while the second arms 43b extend from approximately half of a side of the peripheral region 41 towards the center of the structure. The projecting portions 43 delimit four openings 39 having a rectangular shape.

The suspended mass 38 and the projecting portions 43 are preferably perforated, so as to enable release of the rotor 34 during the manufacturing of the accelerometer, by chemical etching away an underlying sacrificial-oxide layer in a per se known manner.

The rotor 34 further comprises a plurality of mobile electrodes 40, which extend within each window 39 from the second arms 43b. In particular, the mobile electrodes 40 extend in a direction parallel to the base 43c of the respective projection 43.

The suspended mass 38 is supported and biased by a suspension structure, comprising a rotor-anchoring element 44 and elastic elements 45.

The rotor-anchoring element 44 has a square shape and is centered on the centroidal axis G'.

The elastic elements 45 enable movement of the suspended mass 38 along the first axis x and the second axis y, which thus coincide with the axes of detection of the biaxial accelerometer 30, designated by the two-headed arrows A and B.

In detail (see also the cross section of FIG. 3), the rotor-anchoring element 44 is anchored to a substrate 17 of the wafer 32, from which it is electrically insulated through an insulating material region 49, for example of silicon oxide, and is biased through a first biasing region 47, preferably of polycrystalline silicon, arranged between the insulating material region 49 and the rotor-anchoring element 44.

The elastic elements 45 comprise four springs, each having a generally T shape and each including a stem 48 and a head 51. Each stem 48 is thin and elongated, and extends from one side of the rotor-anchoring element 44 to a central point of the side of the peripheral region 41 arranged facing it, each stem 48 extending between a projecting portion 43, on one side, and a stator element 55 (described below), on the other side. In practice, each stem 48 has a length substantially equal to the second arm 43b and extends parallel thereto. Furthermore, each head 51 extends between one side of the peripheral region 41 and the sides of two adjacent projecting portions 43, that face it. In detail, each head 51 comprises two U-shaped segments having one first end arranged as a prolongation of the respective stem 48 and one second end connected to the respective side of the peripheral region 41 at a point directly opposite the point where the stem 48 joins the head 51.

The elastic elements 45 each extend within a respective separation trench 50, which is also T-shaped. The separation trenches 50 are moreover connected to one another by a central trench 52 surrounding the rotor-anchoring element 44.

The stator 35 comprises four stator elements 55, each carrying a plurality of fixed electrodes 42. The stator elements 55 refer two by two to a same axis of detection, in a differential configuration, as described previously with reference to the uniaxial accelerometer 1 of FIG. 1.

In particular, the stator elements 55 have a substantially L shape and are positioned each within a respective opening 39, with a peripheral side 55a adjacent and parallel to the first arm 43a of the respective projection 43, and a central side 55b adjacent and parallel to the stem 48 of an elastic element 45. In practice, the central sides 55b ideally close the U shape of each projection 43 at the top. A further trench 53 separates the peripheral side 55a of the stator elements 55 from the first arm 43a arranged facing it.

Each stator element 55 is anchored to the substrate 17 of the wafer 32 via a stator-anchoring portion 54. According to an aspect of the invention, the stator-anchoring portions 54 are formed at the end of the respective central side 55b closest to the rotor-anchoring element 44. In this way, the stator-anchoring portions 54 are close to the centroidal axis G'. The same considerations made as regards the uniaxial accelerometer 1 apply to the distance between the rotor-anchoring element 44 and the stator-anchoring portions 54.

As with the first biasing region 47 and the rotor-anchoring element 44 (see also FIG. 3), second biasing regions 57 extend underneath respective stator-anchoring portions 54 and are insulated from the substrate 17 via insulating material regions 58. Furthermore, the stator-anchoring portions 54 refer, in pairs, to a same axis of detection, in a differential configuration.

The fixed electrodes 42 extend from the peripheral side 55a of each stator element 55, are parallel with, and face, each, a corresponding mobile electrode 40 in the respective opening 39, in a single-sided configuration.

Finally, the biaxial accelerometer 30 comprises four arrest elements or stoppers 56 located at the corners of the peripheral region 41 of the suspended mass 38. The stoppers 56 (see also FIG. 3) are anchored to the substrate 17 and separated by the peripheral region 41 of the suspended mass 38 by a respective stop trench 58. The stoppers 56 limit the amplitude of movement of the suspended mass 38 in the direction of the first axis x and the second axis y and thus prevent short circuits between the rotor 34 and the stator 35.

Also in this case, it is important to emphasize how the vicinity of the rotor and stator anchorages enable a high insensitivity to the thermomechanical stresses induced by the package to be achieved.

Figure 3:
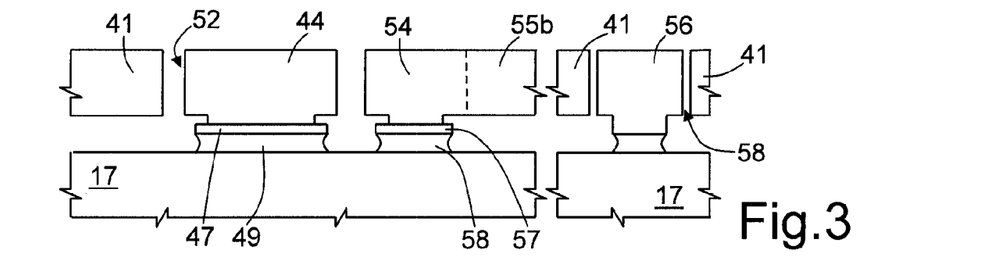
FIG. 3 is a cross-section taken along line III-III of FIG. 2.

The structure of a triaxial accelerometer 60 of a linear type (FIG. 4) is substantially similar to the structure of the biaxial accelerometer 30 described with reference to FIGS. 2 and 3, so that parts that are similar will be designated by the same reference numbers and will not be described again. Only the differences will be described that enable detection of acceleration also along a third axis z, which forms together with the first axis x and the second axis y a set of three orthogonal axes.

Figure 4:
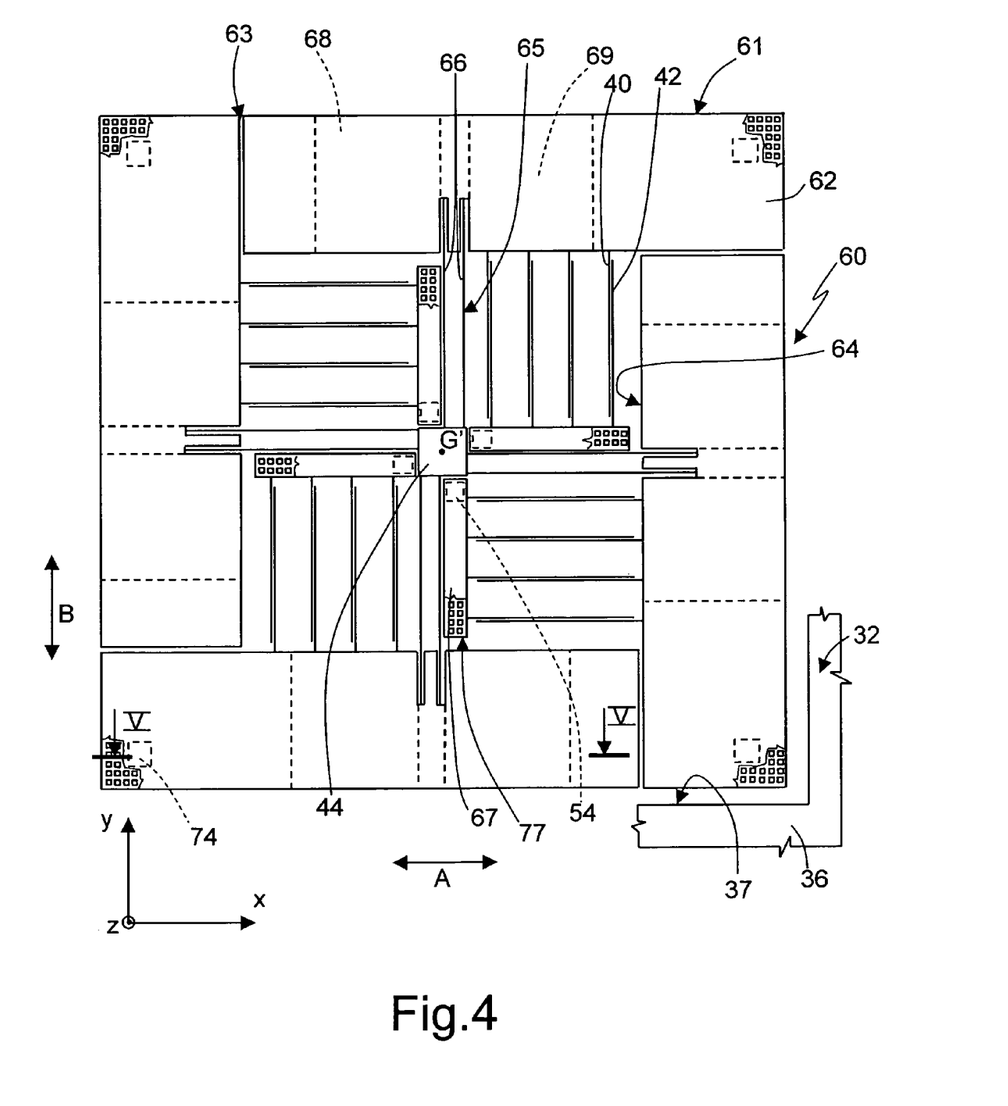
FIG. 4 is a schematic top view of a triaxial linear accelerometer according to the present invention.

In particular, the rotor 61 comprises four suspended masses 62, of a substantially elongated rectangular shape, parallel, two by two, to the axes x and y. The suspended masses 62 are adjacent to one another, separated by an insulation trench 63, and form together a square frame delimiting a substantially square window 64.

The suspension structure that supports and biases the rotor 61 comprises four elastic elements 65, each of which extends from the rotor-anchoring element 44 and supports and biases a respective suspended mass 62.

In detail, each elastic element 65 comprises two springs 66, which are arranged parallel to one another, have a thin rectilinear shape, and extend orthogonal to the long side of the respective suspended mass 62. The springs 66 are arranged at an appropriate distance apart, so as to minimize the rotations of the respective suspended mass 62 about the centroidal axis G' and to enable a translational motion along the axes x and y. Furthermore, the springs 66 enable a tilting of the respective suspended mass 62 about an axis intermediate to the springs themselves so as to enable movement of the respective suspended mass 62 and hence the detection of the acceleration, along the third axis z, as will be clarified in what follows.

The stator 77 comprises four stator elements 67, which have here a rectangular shape and are positioned within the window 64. In particular, each stator element 67 extends on one side of a respective elastic element 65, from the rotor-anchoring element 44 to the suspended mass 62 carried by the adjacent elastic element 65, but is separated both from the rotor-anchoring element 44 and from the suspended mass 62 via appropriate trenches. Also in this case, the stator elements 67 refer two by two to one and the same axis of detection.

First fixed electrodes 42 extend from each stator element 67 and face each a respective mobile electrode 40 extending from the suspended mass 62 facing and parallel to the stator element 67. Also in this case, the arrangement of the electrodes is single-sided.

In order to enable detection of the acceleration along the third axis z, two second fixed electrodes 68, 69 (also called planar electrodes) are formed underneath each suspended mass 62; the second fixed electrodes 68, 69 have a substantially square shape and are arranged on opposite sides of a respective elastic element 65. An air gap 75 extends between the suspended mass 62 and the respective second fixed electrodes 68, 69 (see also FIG. 5).

The second fixed electrodes 68, 69 are preferably of a thin polysilicon layer and form, with the respective suspended mass 62 (forming a common mobile electrode), two variable capacitors. In this way, when a suspended mass 62 tilts, rotating about the intermediate axis with respect to the springs 66, and varies its distance with respect to the second fixed electrodes 68, 69, there is a differential variation in the capacitance of the variable capacitors. Via an appropriate electronics, in a known way, it is thus possible to trace back from the capacitive variation to the displacement of the suspended mass 62, and hence to the acceleration along the third axis z.

In detail (see FIG. 5), the second fixed electrodes 68, 69 are arranged on the top of the substrate 17 and are insulated from the latter by a respective insulating material region 72 and 73, for example of silicon oxide.

Figure 5:
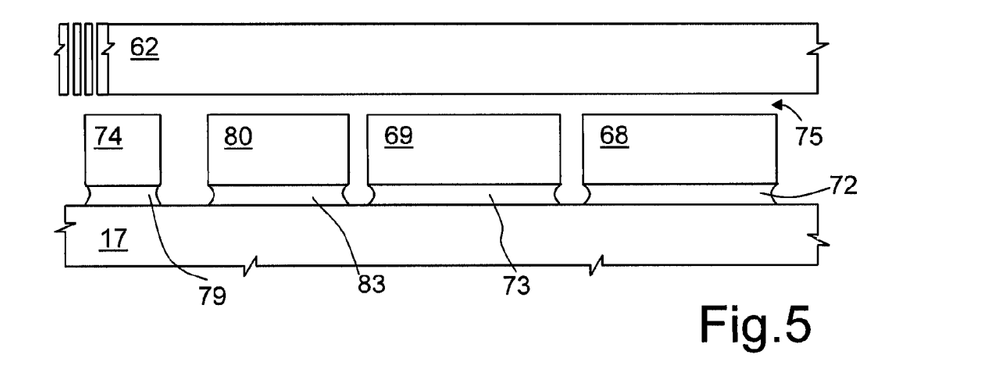
FIG. 5 is a cross-section taken along line V-V of FIG. 4.

To prevent short circuits between each suspended mass 62 and the respective second fixed electrodes 68, 69, further stoppers 74 are provided, and are designed to limit the range of the movement of the suspended masses 62 along the axis z. the stoppers 74 are formed by a respective thin polysilicon region insulated from the substrate 17 by a further insulating material region 79, for example of silicon oxide.

Moreover, self-evaluation electrodes 80 may be provided to evaluate in-field the functionality of the accelerometer. Each self-evaluation electrode 80 is positioned underneath a respective suspended mass 62 near one of the second fixed electrodes 68, 69 and extends on top of an insulating material region 83, for example of silicon oxide, which insulates region 83 from the substrate 17. The self-evaluation electrodes 80, if biased with an appropriate voltage, enable testing of the functionality of the detection of acceleration along the axis z. In fact, via the biasing voltage, it is possible to simulate an acceleration of the respective suspended mass 62 along the axis z, and verify whether the second fixed electrodes 68, 69 detect the simulated acceleration correctly.

Also for a triaxial accelerometer, it is important to emphasize how the rotor-anchoring elements and stator-anchoring elements are arranged close to one another at or in the vicinity of the centroidal axis G' of the structure.

The advantages of the invention are clear from the features thereof.

In particular, the arrangement described of the rotor and stator anchorages enables an improved insensitivity to the disturbance caused by the thermomechanical stresses to be obtained. In fact, the relative displacements between rotor and stator are minimized, which result in capacitive variations and hence in measurement drifts that are induced by the stress deformation of the silicon wafer. In this way, in addition to obtaining sensors more stable in temperature, it is possible to avoid the use of particular packages dedicated to the sensors (such as pre-molded packages, full-molded with gel or ceramics), and use standard and hence less costly packages. In particular, the presence of stator elements, each carrying a plurality of fixed electrodes in a single-sided configuration, makes it possible to obtain a common stator anchorage for a plurality of fixed electrodes. In particular, for each axis of detection there are present just two stator anchorages in a differential configuration, which, if we imagine dividing ideally the accelerometer into quadrants (or else into two halves in the case of a uniaxial accelerometer), are arranged each in a different quadrant (or in a different half) of the accelerometer. It is clear how this effectively makes it possible to position the stator anchorages and rotor anchorages close to one another and to the centroidal axis of the accelerometer.

Furthermore, the embodiments described are applicable to uniaxial accelerometers, to biaxial accelerometers and to triaxial accelerometers. In particular, it enables integration of a structure sensitive to accelerations along the axis z so as to obtain a triaxial accelerometer of small dimensions (the same dimensions along the axes x and y of a biaxial accelerometer) and high stability in temperature.

Finally, it is evident that modifications and variations may be made to the structures described and illustrated herein, without thereby departing from the scope of the present invention, as defined in the annexed claims.

In particular, the arrangement described with the rotor anchorage in a centroidal position and the stator anchorage in an adjacent position can be replaced by the dual arrangement, with the stator anchorage in a centroidal position and the rotor anchorage in an adjacent position.

Furthermore, appropriate stoppers can be provided also for the uniaxial and triaxial accelerometers.

The L shape envisaged for the stator elements of the biaxial accelerometer could be replaced with a rectangular shape.

Finally, it is clear that the idea underlying the disclosed embodiments of the present invention can be applied to various types of microstructures, such as for example gyroscopes, inertial sensors and rotational accelerometers. More in general, embodiments of the present invention find advantageous application in all those microstructures that have fixed and mobile suspended masses, irrespective of the fabrication type (epitaxial, surface or bulk micromachining), and of the type of material used (monocrystalline or polycrystalline silicon, whether deposited or grown, or metallic materials).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A micro-electromechanical structure comprising:
a rotor having a centroidal axis extending substantially perpendicular to an upper face of said rotor, and including a suspended structure which carries mobile electrodes, said suspended structure being connected to a rotor-anchoring region via elastic elements; and
a stator including fixed electrodes facing said mobile electrodes,
said stator further including at least one stator element, carrying a plurality of said fixed electrodes, said stator element being fixed to a stator-anchoring region; and
wherein one of said rotor-anchoring region and stator-anchoring region extends along said centroidal axis and the other of said rotor-anchoring region and stator-anchoring region extends near said centroidal axis.

2. The micro-electromechanical structure according to claim 1 wherein said rotor-anchoring region and said stator-anchoring region are arranged at a minimum distance that can be obtained with the manufacturing processes used for forming the micro-electromechanical structure.

3. The micro-electromechanical structure according to claim 2 wherein said minimum distance is smaller than 10 μm.

4. The micro-electromechanical structure according to claim 1, wherein said rotor-anchoring region and said stator-anchoring region are integral with a body of semiconductor material.

5. The micro-electromechanical structure according to claim 1 wherein said rotor-anchoring region extends along said centroidal axis, and said stator-anchoring region extends near said centroidal axis and said rotor-anchoring region.

6. The micro-electromechanical structure according to claim 5 wherein said suspended structure comprises a peripheral region having a generally frame-like shape defining a plurality of sides, arranged opposite to one another two by two, and delimiting a window; said mobile electrodes extending from said suspended structure within said window in a direction parallel to sides of said peripheral region; and wherein said stator is arranged within said window surrounded by said rotor element, and comprises a plurality of stator elements, each of which carries a respective plurality of said fixed electrodes; each of said mobile electrodes being capacitively coupled to a respective one of said fixed electrodes.

7. The micro-electromechanical structure according to claim 6 wherein said structure is a component of an accelerometer; wherein said stator comprises a pair of said stator elements for each direction of detection of the accelerometer, said stator elements of said pair being arranged symmetrically with respect to said centroidal axis.

8. The micro-electromechanical structure according to claim 6, further comprising a plurality of stoppers, arranged at respective corners of said peripheral region.

9. The micro-electromechanical structure according to claim 6 wherein said structure is a component of a uniaxial linear accelerometer.

10. The micro-electromechanical structure according to claim 9 wherein said elastic elements are connected to said rotor-anchoring region through a suspension body having a rectangular shape, said rotor-anchoring region being formed by a central portion of said suspension body, and said elastic elements extending from a respective extreme edge of said suspension body, parallel to one another and to two opposite sides of said peripheral region.

11. The micro-electromechanical structure according to claim 9 wherein said stator comprises two stator elements having a substantially rectangular shape, arranged on opposite sides with respect to said suspension body and having a first side facing said suspension body and a second side which carries said fixed electrodes.

12. The micro-electromechanical structure according to claim 6 wherein said structure is a component of a biaxial linear accelerometer.

13. The micro-electromechanical structure according to claim 12 wherein said suspended structure comprises four supporting portions carrying said mobile electrodes and aligned to the sides of said peripheral region; and wherein said stator comprises four stator elements, each of which carries a plurality of fixed electrodes; said stator elements comprising a first arm facing and parallel to one side of said peripheral region, said plurality of fixed electrodes extending from said first arm parallel to said mobile electrodes.

14. The micro-electromechanical structure according to claim 13 wherein each said supporting portion belongs to a U-shaped projection extending inside said peripheral region at a sharp edge of said peripheral region, and delimiting a respective opening; and wherein said first arm of said stator element is arranged within said opening and is connected to said stator-anchoring region via a second arm arranged so as to form an L with said first arm; said mobile electrodes carried by one said supporting portion and said fixed electrodes carried by a respective first arm being housed in a respective opening.

15. The micro-electromechanical structure according to claim 13, wherein said elastic elements comprise four springs having a generally T shape; each of said springs being formed by a stem extending from one side of said rotor-anchoring region towards a facing side of said peripheral region, and by a head connected to said peripheral region and extending transverse to said stem; said springs extending each within a respective separation trench connected to a central trench surrounding said rotor-anchoring region.

16. The micro-electromechanical structure according to claim 13, wherein each of said stator-anchoring regions is formed by the end of a respective second arm, close to said rotor-anchoring region.

17. The micro-electromechanical structure according to claim 6 wherein said structure is a component of a triaxial linear accelerometer.

18. The micro-electromechanical structure according to claim 17 wherein said peripheral region comprises four peripheral portions, of substantially rectangular shape, each of which carries said plurality of mobile electrodes extending within said window; and wherein said stator comprises four stator elements, each of which extends approximately from a respective side of said rotor-anchoring region to a facing side of a respective peripheral portion, and which are insulated with respect to said rotor-anchoring region and to said peripheral region; said stator elements each carrying a plurality of fixed electrodes.

19. The micro-electromechanical structure according to claim 18, further comprising a pair of planar electrodes arranged underneath each of said peripheral portions and forming with said peripheral portions capacitive elements for the detection of a movement component of said peripheral portions parallel to said centroidal axis.

20. The micro-electromechanical structure according to claim 18, wherein said elastic elements comprise a pair of springs having a rectilinear shape extending from each side of said rotor-anchoring region to a respective peripheral portion facing said side; said springs being configured so as to enable inclination of the respective peripheral portion about an axis intermediate with respect to said springs.

21. A micro-electromechanical device, comprising:
a semiconductor material substrate;
a plurality of anchoring elements coupled to the substrate, one of the plurality being located at a centroidal axis of the device exten&ng substantially perpendicular to a plane defined by an upper face of the substrate, the remainder of the plurality being located in the proximity of the centroidal axis of the device;
a rotor lying in a spaced-apart relationship with respect to a surface of the substrate and movably coupled to the substrate by a first spring element extending between the rotor and one of the plurality of anchoring elements, the rotor being sized and positioned to surround the plurality of anchoring elements; and
a stator lying in a spaced-apart relationship with respect to a surface of the substrate and coupled to the substrate by another one of the plurality of anchoring elements.

22. The device of claim 21 wherein:
the rotor comprises a first plurality of rotor electrodes, each lying parallel to a first axis and extending from the rotor toward the stator from a first side of the rotor, and a second plurality of rotor electrodes, each lying parallel to the first axis and extending from the rotor toward the stator from a second side of the rotor; and
the stator comprises a first plurality of stator electrodes, each lying parallel to the first axis and extending from the stator toward the rotor in a substantially side-by-side relationship with a respective one of the first plurality of rotor electrodes, and a second plurality of stator electrodes, each lying parallel to the first axis and extending from the stator toward the rotor in a substantially side-by-side relationship with a respective one of the second plurality of rotor electrodes.

23. The device of claim 22 wherein the first and second pluralities of rotor electrodes are positioned, relative to the first and second pluralities of stator electrodes, such that translation of the rotor along a second axis, perpendicular to the first axis, will move one of the pluralities of rotor electrodes closer to their respective stator electrodes while moving the other of the pluralities of rotor electrodes farther from their respective stator electrodes.

24. The device of claim 22 wherein the stator comprises first and second stator elements, each coupled to the substrate by a respective one of the plurality of anchoring elements and surrounded by the rotor, and to each of which is coupled a respective one of the first or second pluralities of stator electrodes.

25. The device of claim 22 wherein:
the rotor comprises third and fourth pluralities of rotor electrodes, each lying parallel to a second axis, perpendicular to the first axis, and extending from the rotor toward the stator from third and fourth sides of the rotor, respectively; and
the stator comprises third and fourth pluralities of stator electrodes, each lying parallel to the second axis and extending from the stator toward the rotor in a substantially side-by-side relationship with a respective one of the third or fourth plurality of rotor electrodes.

26. The device of claim 21, further comprising a plurality of electrodes positioned between the substrate and the rotor, and wherein the rotor comprises a plurality of rotor elements, each coupled to the substrate by a spring element extending between the respective rotor element and the one of the plurality of anchoring elements to which the first spring element is coupledor between the respective rotor element and another of the plurality of anchoring elements, and wherein each rotor element is configured to rotate about a respective axis lying substantially parallel to the surface of the substrate.

27. A device comprising:
a semiconductor substrate;
a single rotor anchor coupled to the substrate at a centroidal axis of the device;
a rotor movably coupled to the substrate via the single rotor anchor, only, and having a plurality of rotor electrodes;
a plurality of stator anchors coupled to the substrate substantially equidistant from the rotor anchor;
a stator coupled to the plurality of stator anchors and having a plurality of stator electrodes, each of the plurality of stator anchors being positioned closer to the rotor anchor than any stator electrode; and
means for reducing sensitivity of the device to dilatation thereof.

28. The device of claim 27 wherein the reducing means comprises adjacent positioning of the plurality of stator anchors to the rotor anchor.

29. The device of claim 28 wherein each of the plurality of stator anchors is separated from the rotor anchor by less than about 10 µm.

30. The device of claim 28 wherein each of the plurality of stator anchors is separated from the rotor anchor by less than about 2 µm.

31. A micro-electromechanical device, comprising:
a semiconductor material substrate;
a plurality of anchoring elements coupled to the substrate in the proximity of a centroidal axis of the device;
a rotor lying in a spaced-apart relationship with respect to a surface of the substrate and movably coupled to the substrate by a plurality of spring elements extending between the rotor and one of the plurality of anchoring elements, the rotor being sized and positioned to surround the plurality of anchoring elements;

a stator lying in a spaced-apart relationship with respect to a surface of the substrate and coupled to the substrate by another one of the plurality of anchoring elements;

a first plurality of rotor electrodes, each lying parallel to a first axis and extending from the rotor toward the stator from a first side of the rotor;

a second plurality of rotor electrodes, each lying parallel to the first axis and extending from the rotor toward the stator from a second side of the rotor;

a third plurality of rotor electrodes, each lying parallel to a second axis and extending from the rotor toward the stator from a third side of the rotor;

a fourth plurality of rotor electrodes, each lying parallel to the second axis and extending from the rotor toward the stator from a fourth side of the rotor;

a first plurality of stator electrodes, each lying parallel to the first axis and extending from the stator toward the rotor in a substantially side-by-side relationship with a respective one of the first plurality of rotor electrodes;

a second plurality of stator electrodes, each lying parallel to the first axis and extending from the stator toward the rotor in a substantially side-by-side relationship with a respective one of the second plurality of rotor electrodes;

a third plurality of stator electrodes, each lying parallel to the second axis and extending from the stator toward the rotor in a substantially side-by-side relationship with a respective one of the third plurality of rotor electrodes; and a fourth plurality of stator electrodes, each lying parallel to the second axis and extending from the stator toward the rotor in a substantially side-by-side relationship with a respective one of the fourth plurality of rotor electrodes.

32. The micro-electromechanical device of claim 31 wherein the stator comprises a plurality of stator elements, each being coupled to the substrate by a respective one of the plurality of anchoring elements, and to each of which is coupled a respective one of the first, second, third, and fourth pluralities of stator electrodes.

33. The micro-electromechanical device of claim 31 wherein the rotor comprises a plurality of rotor elements to each of which is coupled a respective one of the first, second, third, and fourth pluralities of rotor electrodes.

34. The micro-electromechanical device of claim 33, further comprising a pair of planar electrodes positioned on the semiconductor material substrate between each of the plurality of rotor elements and the semiconductor material substrate.

35. The micro-electromechanical device of claim 33, further comprising a self-evaluation electrode positioned on the semiconductor material substrate between each of the plurality of rotor elements and the semiconductor material substrate.

36. A device comprising:

a semiconductor substrate;

a single rotor anchor coupled to the substrate at a centroidal axis of the device;

a rotor movably coupled to the substrate via the single rotor anchor, only, and having a plurality of rotor electrodes;

first and second stator anchors coupled to the substrate substantially equidistant from the rotor anchor; and two stator elements, only, for a first axis of detection of the device, each coupled to a respective one of the first and second stator anchors and having a plurality of stator electrodes.

37. The device of claim 36, comprising:

third and fourth stator anchors coupled to the substrate substantially equidistant from the rotor anchor; and two stator elements, only, for a second axis of detection of the device, each coupled to a respective one of the third and fourth stator anchors and having a plurality of stator electrodes.

38. The device of claim 37 wherein each of the of first, second, third, and fourth stator anchors is positioned closer to the rotor anchor than any stator electrode.

39. The device of claim 36 wherein the rotor comprises a plurality of rotor elements, each coupled to the substrate via the single rotor anchor, only, and wherein the device further comprises a respective pair of planar electrodes positioned on the semiconductor substrate between each of the plurality of rotor elements and the semiconductor substrate.

* * * * *

UNITED STATES PATENT AND TRADEMARK OFFICE
CERTIFICATE OF CORRECTION

PATENT NO.         : 7,322,242 B2
APPLICATION NO. : 11/201268
DATED                 : January 29, 2008
INVENTOR(S)       : Angelo Merassi et al.

Page 1 of 1

It is certified that error appears in the above-identified patent and that said Letters Patent is hereby corrected as shown below:

Column 9
Lines 35 through 37, the carriage return in line 36 should be deleted to read as -- a stator including fixed electrodes facing said mobile electrodes, said stator further including at least one stator element, --

Column 10
Line 4, "of said fixed electrodes; each of said mobile electrodes being" should read as -- of said fixed electrodes, each of said mobile electrodes being --

Column 11
Line 36, "the device exten&ng substantially perpendicular to a" should read as -- the device extending substantially perpendicular to a --

Column 12
Line 29, "spring element is coupledor between the respective rotor" should read as -- spring element is coupled between the respective rotor --

Signed and Sealed this

Fourteenth Day of October, 2008

JON W. DUDAS
*Director of the United States Patent and Trademark Office*